US011026376B2

United States Patent
Mewes et al.

(10) Patent No.: US 11,026,376 B2
(45) Date of Patent: Jun. 8, 2021

(54) CUSTOMIZED LAND SURFACE MODELING IN A SOIL-CROP SYSTEM USING SATELLITE DATA TO DETECT IRRIGATION AND PRECIPITATION EVENTS FOR DECISION SUPPORT IN PRECISION AGRICULTURE

(71) Applicant: DTN, LLC, Omaha, NE (US)

(72) Inventors: John J. Mewes, Mayville, ND (US); Robert C. Hale, Grand Forks, ND (US)

(73) Assignee: DTN, LLC, Omaha, NE (US)

( * ) Notice: Subject to any disclaimer, the term of this patent is extended or adjusted under 35 U.S.C. 154(b) by 0 days.

(21) Appl. No.: 16/179,559

(22) Filed: Nov. 2, 2018

(65) Prior Publication Data

US 2019/0230875 A1    Aug. 1, 2019

Related U.S. Application Data

(63) Continuation-in-part of application No. 15/883,017, filed on Jan. 29, 2018, now Pat. No. 10,139,797, which is a continuation of application No. 15/229,968, filed on Aug. 5, 2016, now Pat. No. 9,880,537.

(60) Provisional application No. 62/201,117, filed on Aug. 5, 2015.

(51) Int. Cl.
*A01G 25/16*    (2006.01)
*G06F 30/20*    (2020.01)

(52) U.S. Cl.
CPC .......... *A01G 25/167* (2013.01); *G06F 30/20* (2020.01)

(58) Field of Classification Search
CPC .............................. A01G 25/167; G06F 30/20
See application file for complete search history.

(56) References Cited

U.S. PATENT DOCUMENTS

| | | | | |
|---|---|---|---|---|
| 4,876,647 A * | 10/1989 | Gardner | ................. | A01G 25/16 700/284 |
| 4,992,942 A * | 2/1991 | Bauerle | ................. | A01G 31/00 700/284 |
| 6,236,907 B1 * | 5/2001 | Hauwiller | ............ | A01B 79/005 111/200 |
| 6,298,285 B1 * | 10/2001 | Addink | ................. | A01G 25/16 239/63 |
| 6,597,991 B1 * | 7/2003 | Meron | ................. | A01G 25/167 382/110 |
| 6,892,113 B1 * | 5/2005 | Addink | ................. | A01G 25/16 137/624.11 |
| 6,999,877 B1 * | 2/2006 | Dyer | ..................... | G06Q 10/00 702/2 |

(Continued)

*Primary Examiner* — Michael J Huntley
(74) *Attorney, Agent, or Firm* — Kutack Rock LLP

(57) ABSTRACT

An irrigation modeling framework in precision agriculture utilizes a combination of weather data, crop data, and other agricultural inputs to create customized agronomic models for diagnosing and predicting a moisture state in a field, and a corresponding need for, and timing of, irrigation activities. Specific combinations of various agricultural inputs can be applied, together with weather information to identify or adjust water-related characteristics of crops and soils, to model optimal irrigation activities and provide advisories, recommendations, and scheduling guidance for targeted application of artificial precipitation to address specific moisture conditions in a soil system of a field.

29 Claims, 2 Drawing Sheets

(56) References Cited

U.S. PATENT DOCUMENTS

| | | | | |
|---|---|---|---|---|
| 7,048,204 B1* | 5/2006 | Addink | ............... | A01G 25/167 137/78.2 |
| 7,184,892 B1* | 2/2007 | Dyer | ..................... | G06Q 10/00 702/2 |
| 7,412,303 B1* | 8/2008 | Porter | .................. | A01G 25/167 239/69 |
| 2003/0109964 A1* | 6/2003 | Addink | .................. | A01G 25/16 700/284 |
| 2005/0072862 A1* | 4/2005 | Skinner | .................. | A01G 25/16 239/542 |
| 2009/0216594 A1* | 8/2009 | Verhey | ............... | G06Q 10/0637 705/7.36 |
| 2010/0032495 A1* | 2/2010 | Abts | .................... | A01G 25/167 239/69 |
| 2011/0313666 A1* | 12/2011 | Hirvi | ........................ | A01G 2/00 702/2 |
| 2012/0109387 A1* | 5/2012 | Martin | ................. | G05B 19/042 700/284 |
| 2014/0012732 A1* | 1/2014 | Lindores | ................ | G06Q 50/02 705/37 |
| 2015/0272017 A1* | 10/2015 | Hedley | .................. | A01G 25/16 700/284 |
| 2016/0078375 A1* | 3/2016 | Ethington | .............. | G06Q 10/04 705/7.27 |
| 2017/0311559 A1* | 11/2017 | Ebert | .................... | G01N 33/246 |
| 2018/0014452 A1* | 1/2018 | Starr | ........................ | A01G 7/00 |

\* cited by examiner

CUSTOMIZED LAND SURFACE MODELING IN A SOIL-CROP SYSTEM USING SATELLITE DATA TO DETECT IRRIGATION AND PRECIPITATION EVENTS FOR DECISION SUPPORT IN PRECISION AGRICULTURE

CROSS-REFERENCE TO RELATED PATENT APPLICATION(S)

This patent application claims priority to, and is a continuation-in-part of, U.S. non-provisional application Ser. No. 15/883,017, filed on Jan. 29, 2018, the contents of which are incorporated in their entirety herein. In accordance with 37 C.F.R. § 1.76, a claim of priority is included in an Application Data Sheet filed concurrently herewith.

FIELD OF THE INVENTION

The present invention relates to precision agriculture. Specifically, the present invention relates to a system and method for simulating a soil-plant-atmosphere system as it relates to moisture available to a crop and associated fields and soils for optimal management of irrigation activities, using spatially and temporally disaggregated satellite data to detect prior irrigation and precipitation events.

BACKGROUND OF THE INVENTION

Irrigation is a common practice in agriculture, particularly in areas that may be otherwise marginal or unsuitable for crop production. Irrigation provides the moisture necessary to sustain plant health during the growth cycle, and typically results in improvements to crop yield or quality. Irrigation can also be useful for controlling the moisture of a seed crop to be harvested, moderating the effects of temperature extremes (hot or cold), and as a means of applying vital nutrients to a living crop. In some instances, crop production is not possible without the water provided through irrigation activities, while in others irrigation may serve primarily as insurance against occasional bouts of dry weather.

The water used in irrigation is typically obtained from either ground water or surface water resources. Wells that are drilled deep into the ground to tap into aquifers are a common source, as are rivers, canals and pipelines from surface water resources. In many instances there are concerns over depletion of public water resources, which can make the water efficiency of irrigation activities a vital concern. Irrigation efficiency can be controlled using a number of different approaches, ranging from minimizing water lost to the atmosphere (using a combination of irrigation timing and/or system configuration such as drop nozzles, drip irrigation or even sub-surface irrigation) to maintaining only the bare minimum amount of soil moisture necessary to maintain plant health.

Maintenance of soil moisture at the desired level may involve the use of soil moisture sensors within the field, or methods for tracking the available water in the soil moisture 'bank' through the estimation of draws and deposits of water throughout the course of the growing season. The latter is typically done by tracking the deposits due to rainfall or previous irrigation activities against estimations of water drawn out of the soil profile by the crop and/or lost to direct evaporation from the soil, with the goal of maintaining a steady balance between these competing forces.

The estimation of water drawn out of the soil profile by the crop and/or lost to direct evaporation from the soil is usually done using equations for estimating the evapotranspiration of water from the soil. Evapotranspiration (often denoted as 'ET') refers to the summation of evaporation and plant transpiration of water from the soil and into the atmosphere, and describes the latent flux of heat from the Earth's surface into the atmosphere. Evaporation accounts for the conversion of liquid water resident near the soil surface or on the plant itself into a gaseous form. Transpiration is the process by which moisture is carried through plants from roots to small pores on the leaves (called 'stomata'), where it changes to vapor and is released to the atmosphere. Transpiration is essentially evaporation of water from inside of plant leaves, and has two main functions: keeping the plant cool, and pumping water (and the minerals contained therein) to the plant leaves in support of photosynthesis.

Plants need to cool themselves, as when temperatures are too high, metabolic functions and growth and/or flowering may slow, stop, or the plant may even die. The heat lost from the plant during evaporation from the plant stomata maintains an acceptable temperature within the plant system. The loss of water through transpiration is regulated by guard cells on the sides of the stomata that effectively open and close the pores. These guard cells are sensitive to light intensity, temperature, wind, relative humidity, as well as the carbon dioxide concentration within the leaves. The guard cells must open access to the stomata for the plant to take in carbon dioxide needed for photosynthesis, but the more they are open, the more plants transpire and lose water. As plants transpire, water is drawn from the soil and up through the plant, causing the soil to become drier. In order to maintain an adequate supply of moisture in the soil, precipitation and/or irrigation is required.

As mentioned previously, tracking the amount of water lost from the soil moisture bank, particularly in the absence of soil moisture sensors and/or in the case of forecasting irrigation needs, is typically accomplished using equations for estimating the evapotranspiration of water. Many such equations and methods exist.

Perhaps the most common equation used in modern irrigation scheduling is the Penman-Monteith equation, which is used as a standard by the United Nations Food and Agriculture Organization (FAO). The Penman-Monteith equation relates plant properties to weather conditions (including temperature, humidity, wind, and radiation) to the mass or volume of water lost to evapotranspiration. Since the plant properties vary from one type of plant to the next, and can also vary throughout the growth cycle, it is common to calculate actual evapotranspiration of a crop (ETc) using calculations based on a reference crop (usually a short green crop, such as alfalfa or grass) multiplied by modulating coefficients:

$$ETc = ETr \times Kc \times Ks$$

where ETr is the evapotranspiration rate from the reference crop, Kc is a crop coefficient that varies by crop and growth stage, and Ks is a water stress coefficient that reduces the rate of evapotranspiration as soils become dry. At any given point in a crop's growth cycle, the Kc value for a non-stressed crop is simply the ratio of its actual evapotranspiration rate relative to that of the reference crop. Values of Kc may be near 0 for seedlings and range upward to values in excess of 1.0 for some crops at peak vegetative stage with canopies fully covering the ground. Appropriate Kc coefficients for most common crops, varying throughout the growth cycle, have been measured and published by various organizations. The water stress coefficient, Ks, is set to a value of 1.0 for a crop that is not experiencing any moisture stress, but decreases according to the reduction of evapotranspiration of a crop experiencing increasing moisture stress (or other stressors such as disease, nutrient deficiency, etc.).

While widely applied, these approaches to estimating evapotranspiration have several important limitations. Stomatal resistance (or the plant-integrated equivalent often referred to as 'canopy resistance'), which represents plant-specific properties in ET calculations, is a measure of the resistance to carbon dioxide entering, or water vapor exiting, through the stomata of a leaf, and is controlled by the leaf through the use of guard cells. The canopy resistances to transpiration are dependent upon many factors, including crop and growth stage, and impact overall evapotranspiration calculation in non-linear ways. Thus, these approaches are substantially simplified representations of the movement and use of water within the soil-plant-atmosphere system.

Such approaches also treat the soil moisture as a simple bank, with draws and deposits, but with no understanding of the distribution or movement of water within this bank relative to the distribution and moisture uptake capacity of the plant roots. The potential loss of moisture from the bank due to sub-surface drainage is ignored, as is the ability of moisture to move upward from below the rooting zone due to capillary or osmotic forces. The timing and magnitudes of water inputs, time-varying plant uptake, and changes in the characteristics of the soil with depth can all lead to substantial variations in soil moisture with depth, and this moisture distribution relative to the root distribution of the growing crop is vitally important to understanding the water needs of the crop.

The soil characteristics and soil moisture content also directly affect the strength of the binding of water molecules to the soil, thereby modulating the ability of the plant to extract moisture from it. For instance, water bonds much more tightly to clay soils (with small pores spaces) than it does to sandy soils (with larger pore spaces), causing the moisture content associated with the 'wilting point' of clay soils to be substantially higher (i.e., plants will experience moisture stress at higher moisture contents). While the variability of this binding between soils is represented by Ks in the example ETc calculation above, a single value representative of the properties of the soil at a given location must be selected and used, even though the actual relationship is time-varying and dependent upon root distribution relative to the vertical profile of soil characteristics. Field-specific factors that affect water movement and availability also include factors such as organic matter and the influences of compaction, tillage, and decayed root channels or root worm holes, all of which are substantially dependent upon the nature of the farming practices within a given field.

Because of these limitations, there is value in improving the simulation of crop moisture needs using more sophisticated approaches for modeling these complex systems. Modern land surface models, developed largely in response to the need for understanding the large-scale interactions between the soils, plants and atmosphere as important factors driving weather and climate, offer a potential starting point for a next generation of irrigation scheduling models. The earliest land surface models, often referred to as 'bucket models', were substantially similar in nature to the typical models used in scheduling irrigation today. Over time, land surface models have evolved to use sophisticated multi-layer canopy and soil models, with explicit simulation of many of the processes at work in the soil-plant-atmosphere system. Such simulations include, but are not limited to:

simulation of runoff and infiltration of precipitation off of or into the soil profile;

gravitational drainage, vapor diffusion, capillary action, and root uptake of moisture within any number of layers within a soil profile;

aquifer depletion and recharge;

direct exchanges of moisture between the atmosphere and the soil surfaces via evaporation, sublimation, condensation and deposition;

vertical diffusion and conduction of internal energy (heat) into, out of, and within the soil profile;

loss and gain of thermal energy to plants through radiation, conduction, evaporation, sublimation, condensation, and deposition;

moisture accumulation and loss to plant leaf surfaces as a result of intercepted precipitation, condensation, deposition, evaporation and sublimation;

rate of photosynthetic activity; and plant growth and transpiration, including the impacts of weather and soil conditions on the properties and processes of the vegetation.

Commonly-used land surface models include the NOAH community land surface model, originally developed jointly by the National Centers for Environmental Prediction (NCEP), the Oregon State University (OSU), the United States Air Force, and the National Weather Service's Office of Hydrology (OH). They also include the VIC model, or Variable Infiltration Capacity model, developed by the University of Washington's Land Surface Hydrology group, and the Mosaic model, developed by the National Aeronautics and Space Administration (NASA). Another example is the CLM model, or Community Land Model, a collaborative project between divisions and groups within the National Centers for Atmospheric Research (NCAR). Numerous other land surface models are available for both research and commercial applications.

Land surface model inputs include soil composition and characteristics, topography, vegetation/canopy characteristics, various relationships and characteristics defining the soil-water-plant relationships, and detailed weather information (including detailed precipitation and radiation information). In an agricultural setting, however, other inputs or factors that may be very specific to a given field may be important, such as farming practices and the impacts they have on soil structure, the presence of artificial drainage systems, the specific crop planted on a field and its growth stage, irrigation activities, etc. A collection of techniques for specifying and tuning such field-specific parameters to enable application of land surface models for irrigation-specific scheduling, recommendations and advisories is the subject of this invention.

BRIEF SUMMARY OF THE INVENTION

The present invention provides a system and method for combined application of weather and climatological data, land surface models, other agronomic models, and crop-specific information to improve upon present practices in irrigation modeling. These systems and methods can be expanded to combine additional information, such as irrigation-specific data regarding past activity and field-specific and/or soil-specific properties, and both remotely-sensed and in-situ observations of real-time moisture conditions in a field. In the case of remotely-sensed and in-field weather observations, these may be combined with weather models to assess weather and climatological conditions in an arbitrarily-located field, potentially even including spatial variations in weather conditions within the field. This information can be applied to land surface models to understand the impacts of the varying weather conditions on the need for irrigation.

The application of a land surface model to irrigation can also lead to other improvements, such as irrigation scheduling and other irrigation-specific recommendations and advisories provided to a user. For instance, spatially-varying soil composition data within a field can be used in concert with the land surface model to create spatially-varying recommendations on the need for irrigation across a field. A land surface model with a runoff routing module can be added to further improve the simulation of the effects of terrain on the spatial variability in soil water throughout a field. The use of a land surface model with sophisticated handling of processes occurring within the crop canopy can also be used to diagnose and predict periods of leaf wetness, and to simulate the augmentation of those periods of leaf wetness by irrigation activities, as an indicator of the potential for creating unnecessary crop disease pressure through poor irrigation scheduling. This can be accomplished by organizing irrigation scheduling by management zones or other gridded breakdowns of fields, so that a variable-rate application of artificial precipitation allows for additional efficiencies in resource utilization.

Information provided by a grower or crop advisor can also be used to improve the configuration and assumptions of the land surface model. For instance, the crop planted on the field, its planting date, and/or its relative maturity can be applied in conjunction with the weather and climatology data and a crop growth model to diagnose and predict the growth profile of the crop over the course of the season. This growth profile, which can be augmented throughout the season based on actual growth stages, can be used to apply time-varying values to properties of the crop that are relevant to the physics of the land surface model, including leaf area index (LAI), vegetative fraction, crop height, and root distribution, all of which impact calculations of moisture uptake from the soil and the rate of transpiration by the crop.

Similarly, the field may have artificial drainage structures that impact the movement of water within the field, such as drain tile. This user-provided information can be used to modulate drainage properties in the land surface model, thereby providing a better understanding of the latent impacts of periods of soil saturation. The farming practices applied on the field, such as conventional, limited or no-tillage practices, are known by the user and can be also be used to augment the land surface model simulations. For instance, a field under reduced-tillage practices is likely to have more crop residue on the soil surface that may reduce direct soil evaporation, and is also likely to have more structures (such as decayed roots or wormholes) that promote water infiltration instead of runoff. These subjective classifications can be used to refine parameters within a land surface model, or the user can also be provided the ability to provide measured soil profile characteristics into the land surface model simulation in order to further refine land surface model parameters.

The use of a land surface model to simulate conditions within a field can also increase the value of soil temperature or moisture observations taken from the field. If multi-level observations are available, the land surface model's profile of the same can be adjusted accordingly, and the evolution of the soil profile into the future can be simulated. This can improve the assessment and prediction of the distribution of water within the soil profile relative to root distributions and the capacity for plant uptake, for example. The presence of in-field observations can also be used to tune the land surface model to a field or crop's properties. For instance, changes in the soil moisture or temperature profile over time provide intrinsic indicators of the thermal or hydraulic conductivity properties of the soil that can be used to augment the land surface model assumptions of the same. Soil moisture observations as a function of depth and time can also be used to infer root depth, as a diurnal cycle in the soil moisture at levels within the root zone (owing to increased root uptake during the daytime followed by redistribution of moisture into the root zone during the overnight hours) can be used to infer root depth and distribution density.

Yet another advantage of the application of land surface models in irrigation scheduling is the ability to combine them with remotely-sensed data and in-situ observations of the crop to diagnose crop characteristics and needs. For instance, application of a land surface model can help to automatically differentiate between areas of reduced crop health caused by water stress (too much or too little), or potential nutrient loss (due to leaching or denitrification caused by excess water). This information can be used to notify producers of problems occurring within a field that may be addressable through producer-initiated activities. Remotely-sensed data, such as from unmanned aerial vehicles or high-resolution satellites, can also be used to improve the assessment of real-time parameters in the overall modeling system, such as vegetative fraction, leaf area index, or crop height.

Remotely-sensed image data may also be included to further analyze historical irrigation and other precipitation events to simulate conditions within a field, to create high-resolution maps of the field to analyze latent heat flux associated with evapotranspiration, as well as soil moisture, and other data. The present invention may incorporate data processing techniques to achieve both a high spatial resolution and a high temporal resolution in thermal images provided by sources such as satellite systems. This would be needed since different satellites acquire images across different distances, and at different times. Higher spatial resolution of imagery data is needed for example to identify that irrigation occurred on a field of interest, and not a neighboring field that falls within the same coarse resolution satellite pixel. Higher temporal resolution of imagery data is needed for example to identify which specific day the irrigation was applied, within a time span relative to satellite overpasses for the field of interest. The present invention incorporates techniques of both disaggregation and fusion for such imagery to achieve these higher spatial and temporal resolutions.

It is therefore one objective of the present invention to provide a system and method of developing a customized land surface model as an aid in scheduling irrigation activities and generating irrigation recommendations. It is another object of the present invention to provide a system and method of applying weather and climatology data, and crop or field-specific data to one or more coupled crop and soil simulation models of one or more physical and empirical characteristics impacting the moisture state in the soil system to profile various aspects of the moisture state for the purpose of scheduling irrigation activities and generating irrigation recommendations. It is another objective of the present invention to couple crop growth models and land surface models for improved simulation of moisture conditions within a field and the associated impact on the quantity and distribution of soil moisture within the field.

It is a further object of the present invention to provide a system and method of applying weather and climatology data, and crop or field-specific data to one or more coupled crop and soil simulation models of one or more physical and empirical characteristics to schedule irrigation activities and generating irrigation recommendations to aid in the transport of a nutrient, such as nitrogen, that is applied to the soil system. It is a further object of the present invention to provide a system and method of applying weather and climatology data, and crop or field-specific data to one or more coupled crop and soil simulation models of one or more physical and empirical characteristics to schedule irrigation activities and generating irrigation recommendations to aid in minimizing losses of water to drainage, and of nitrogen to both leaching or denitrification. It is yet a further object of the present invention to provide a system and method of applying weather and climatology data, and crop or field-specific data to one or more coupled crop and soil simulation models of one or more physical and empirical characteristics to schedule irrigation activities and generating irrigation recommendations to aid in encouraging crop root growth into preferred depths where more readily-available nutrients may reside (for instance, if excessive rainfall early in a growing season caused nitrogen to be leached deeper into the soil profile, irrigation activities (or the lack thereof) may be one means of encouraging the crop's roots to grow deeper, where these nutrients can then be tapped).

It is yet another objective of the present invention to use in-situ weather and/or soil temperature or moisture observations to augment inputs to and parameters of a customized land surface model to improve the accuracy of the model at simulating conditions within the field, and thereby improving the scheduling of irrigation activities. It is a further objective of the present invention to permit the combined application of user-provided data, agronomic and land surface models and outputs, and a combination of in-situ and remotely-sensed observations of the crop in a field to diagnose the cause of areas of reduced vegetative health in a field and inform the user as to potential actions that can be taken to remedy the situation.

Other objects, embodiments, features, and advantages of the present invention will become apparent from the following description of the embodiments, taken together with the accompanying drawing, which illustrates, by way of example, the principles of the invention.

BRIEF DESCRIPTION OF THE SEVERAL VIEWS OF THE DRAWINGS

The accompanying drawings, which are incorporated in and constitute a part of this specification, illustrate several embodiments of the invention and together with the description, serve to explain the principles of the invention.

DETAILED DESCRIPTION OF THE INVENTION

Figure 1:
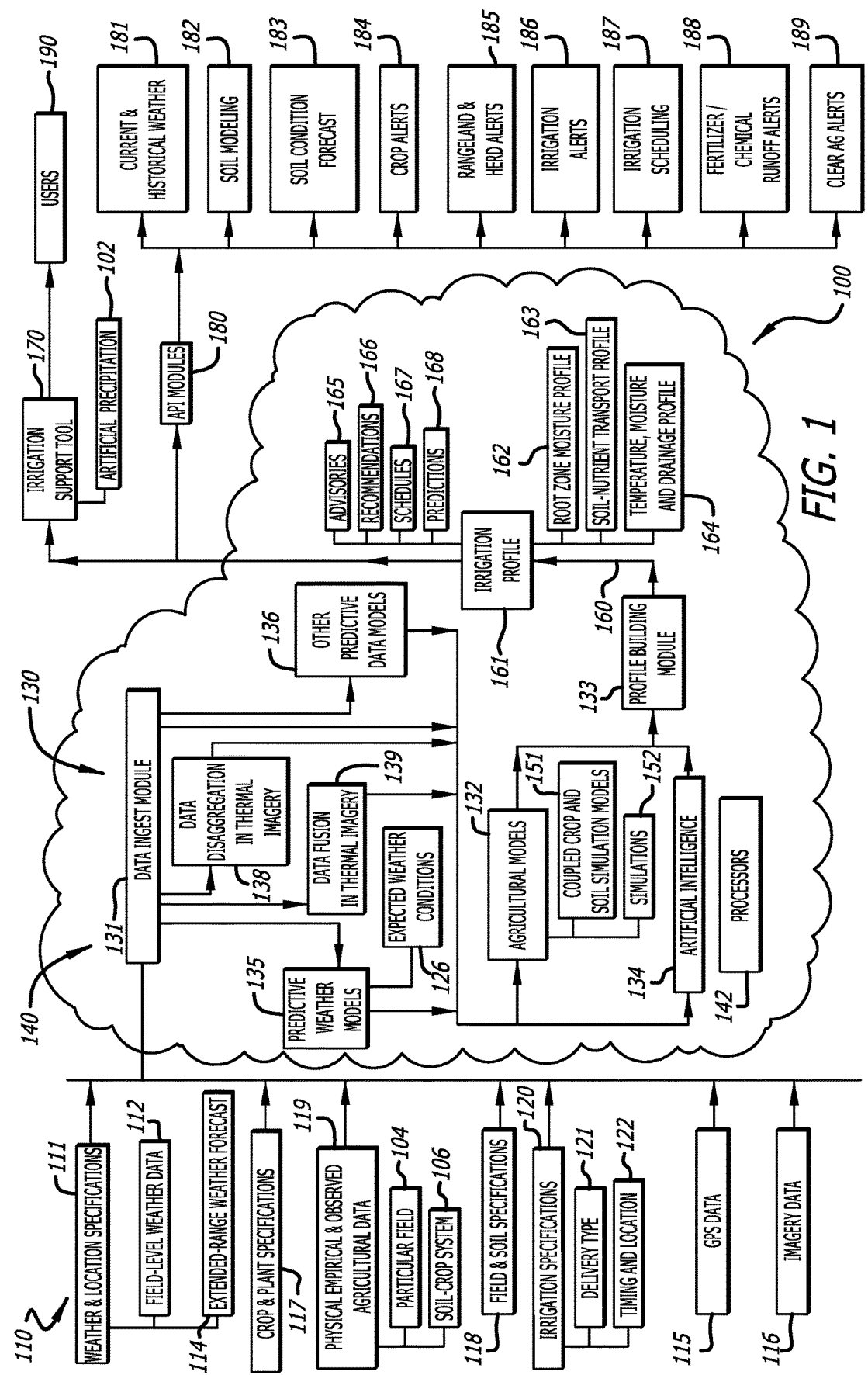
FIG. 1 is a system diagram of an irrigation modeling framework according to the present invention.

In the following description of the present invention, reference is made to the exemplary embodiments illustrating the principles of the present invention and how it is practiced. Other embodiments will be utilized to practice the present invention and structural and functional changes will be made thereto without departing from the scope of the present invention.

The present invention is, in one aspect thereof, an irrigation modeling framework 100 performed in one or more systems and methods that simulate, as noted above, a soil-plant-atmosphere system as it relates to moisture available to a crop and associated fields and soils, and generate one or more outputs to aid users in managing irrigation activities in precision agriculture. The soil-plant-atmosphere system is simulated in a customized land surface model, comprised of one or more coupled crop and soil simulation models of one or more physical and empirical characteristics impacting various aspects of a moisture state in the soil-plant-atmosphere system. The irrigation modeling framework 100 may also be considered as part of an agronomic decision support toolset, which may include an irrigation support tool 170 as noted further herein that allows users to manipulate and customize the modeling paradigms performed, on various types of input data, to produce desired irrigation-related output information.

The present invention simulates the soil-plant-atmosphere system using its customized land surface modeling in several different ways. In one aspect of the present invention, soil-water characteristics in a crop root zone relative to one or more crop growth stages of a crop in a particular field are simulated to develop a root zone moisture profile representing an assessment of the proximity of soil moisture to the spatially-distributed crop root system. This is used to optimize irrigation activities generally with respect to the crop's root system, to achieve desired growth at different stages thereof. In another aspect of the present invention, moisture flows within a soil system relative to a rate of water movement at different crop growth stages are simulated to develop a soil-nutrient transport and distribution profile representing an assessment of how moisture conditions impact movement of substances throughout the soil system. This is used to determine a transport of applied nutrients, such as nitrogen, to a root zone depth where it can most readily be taken up by a growing crop. In still another aspect of the present invention, temperature, moisture and drainage profiles relative to moisture and nutrient gains, losses, and movement within a soil-crop system at different crop growth stages are simulated, representing an assessment of how soil characteristics affect the amount of water and nutrients in the soil system. This is used to minimize losses of water due to drainage, and of nutrients such as nitrogen to both leaching and, in the case of nitrogen specifically, denitrification due to extended periods of saturation turning soil nitrogen into a gaseous form that is then lost to the atmosphere.

In one embodiment, the present invention is configured to generate output data for planning of irrigation activities, for example in the form of irrigation scheduling, recommendations, and advisories, from an application of the customized land surface modeling to artificial precipitation characteristics. Such an irrigation scheduling embodiment provides growers, landowners, and other agricultural stakeholders such as rangeland managers and livestock/herd owners with the "when" and "how often" of artificial precipitation. Irrigation schedules may be created and provided as an advisory service based on, for example, field water loss from modeled evaporation and evapotranspiration and forecasted precipitation, and may also be configured to manage different irrigation systems such as flood, drip, and spray irrigation.

In another embodiment, the present invention is configured to generate output data for planning of irrigation activities to reduce over-irrigation of soil layers and tailor irrigation activities to the desired soil moisture content. This represents a soil-focused application of customized land surface modeling to generate advisories and other output data for irrigation decision support. For example, the present invention may be configured to generate as an output an advisory regarding cost reduction, or waste-of-water reduction, in drought hit areas. In another example, the present invention may be configured to generate as an output an advisory regarding fertilizer or chemical runoff, and a corresponding impact on the environment, such as an impact on animal or insect populations.

In yet another embodiment, the present invention is configured to generate output data for planning of irrigation activities that is refined for specific crops, such as for example irrigation scheduling for a crop's current growth stage, and its forecasted upcoming growth stages. This represents a crop-focused application of customized land surface modeling to generate advisories for irrigation decision support that allows growers to tailor their irrigation activities to deliver the right amount of artificial precipitation at the right time.

In still another embodiment, the present invention is configured to provide dynamic, site-specific variable rate irrigation information with respect to management zones that provide a breakdown of a particular field. This represents information to the grower as to where in the field to apply artificial precipitation, and when to apply it, as well as adjusting the application of artificial precipitation at different locations within a field.

FIG. 1 is a system diagram of an irrigation modeling framework 100 for diagnosing, predicting, simulating, and evaluating various agronomic conditions that have an impact on water and moisture in soil-plant-atmosphere systems. The irrigation modeling framework 100 is utilized, as noted above, to generate outputs that allow crop advisors, growers, and other responsible entities to manage the application of artificial precipitation 102 and irrigation activities in crops, fields 104, and soils 106. These outputs may be generated as one or more of irrigation advisories, irrigation recommendations, irrigation schedules, and/or predictions and forecasts of artificial precipitation needs. The irrigation modeling framework 100 is performed within one or more systems and/or methods that includes several components, each of which define distinct activities required to apply field-level data representative of real-time assessments of localized weather conditions, together with long-range climatological and/or meteorological forecasting and other real-time and location-tagged data of various types and content, and to analyze crops, plants, soils, and agricultural products. The outputs may also be applied to an irrigation support tool 170 configured to provide users with diagnostic support for agricultural operations.

The irrigation modeling framework 100 ingests, receives, acquires, or otherwise obtains input data 110 that at least includes weather and location specifications 111 comprised of the weather and climatological information noted above. These specifications 111 may include recent, current, or historical weather data 112 such as field-level conditions that have occurred, for example, in real-time and/or during a current growing season or historically in past growing seasons, and extended-range weather and climatological forecast information 114, relative to fields 104 and soil systems 106 for which irrigation-specific outputs are desired.

The weather and location specifications 111 may also include other types of real-time and location-tagged data, such as for example GPS data 115, and data captured from orbiting satellites or remotely powered vehicles that when processed provide details at a field-level resolution, such as remotely-sensed satellite imagery data and remotely-captured drone imagery data 116. Imagery data 116 may be further used within the present invention to extract relevant weather, crop, soil, or field information for use in the one or more precision agriculture (agronomic) models 150 to perform the various simulations 152 described herein. As noted further below, imagery data 116 may include spatially and temporally disaggregated satellite data and thermal images taken by satellites providing such data, and this may be incorporated into the irrigation modeling framework 100 of the present invention to also detect prior irrigation and precipitation events for the one or more precision agriculture (agronomic) models 150 and the various simulations 152 performed. Additionally, the irrigation modeling framework 100 of the present invention may include one or more data fusion and disaggregation techniques for processing and analyzing information within such imagery data 116, either as part of the one or more additional predictive data models 136 or otherwise.

GPS data 115 may be further used to enable one or more GPS receivers to determine positional coordinates and/or boundaries of a particular field 104 (and, a soil system 106 or crop within the particular field 104). This may enable a geographical correlation with the various other types of input data 110, such as the crop and plant specifications 117, the field and soil specifications 118, and the irrigation-specific information 120, for performing the simulations 152 and building the soil-plant-atmosphere profiles 161 described further herein.

Extracted GPS data 115 may also enable output data 160 to be further analyzed according to one or more management zones within the particular field 104, and may further allow for instructions to be specifically tailored to a specific crop growing in a portion of the particular field 104, or for specific irrigation equipment positioned in a particular field 104, when correlated with other associated GPS coordinates. For example, an irrigation schedule 167 generated by the present invention may be provided directly to irrigation equipment positioned in a specific zone of a particular field by correlating its position with that of extracted GPS data 115.

The input data 110 may further include crop and plant specifications 117. This may include the type, variety and relative maturity of a crop growing in a field 104, the type and variety of seed(s) used, and other planting, seeding, chemical application, and harvest data, such as for example the date that a field 104 was planted with seed, the population of planted seeds per specified area, when a field 104 was sprayed for example with a pesticide, desiccant, other chemical, the type and amount of chemical applied, and anticipated temporal harvest data such as an expected harvest date or harvest window. The crop and plant specifications 117 may also include desired crop temperatures, crop moisture, seed moisture, and crop growth stage data. Additional information may include planting information such as plant depth, row width, and a crop's specific planting location within a field 104 or management zone within a field 104.

The input data 110 may also include field and soil specifications 118, which may further include information such the soil type in which a crop was planted, and attributes such as soil temperature, soil moisture, current and/or forecasted soil conditions, overall soil profile, levels of vegetative debris existing at the time of planting, and nutrient levels present. Field and soil specifications 118 may also include fertilization activities data representing timing, type, and location of treatments (such as fertilizers, other nutrients, and chemical and biological agents) applied to a soil system 106, and nutrient profile data generate from one or more soil samples in the particular field 104. Field and soil specifications 118 may further include an identification of a particular field 104 to be modeled, such as GPS coordinates identifying the field 104 and any specific zones or locations within the field 104. Therefore, GPS information may be included in both weather and location specifications 111, and in field and soil specifications 118.

The input data 110 may also include physical, empirical, or observed agricultural data 119. This may include in-situ data and ground truth data representative of samples and/or direct field observations of actual crop and soil moisture content taken from a field 104 at one or more times. Other examples of such data include data regarding temporal harvestability windows for a particular crop at a particular location over some recent period of time, or for various crops at various locations, over time. The physical, empirical, or observed agricultural data 119 may further include descriptive metadata reflecting actual performance, realization, or implementation of one or more of crops, plants, fields, soils, and artificial precipitation delivery systems.

This metadata may also include crop and seed metadata such as the relative maturity and dry-down characteristics of the crop variety, pest and disease susceptibility or resistance, and type and origin of seeds (for example, genetically modified or non-genetically modified, and company source), and whether a crop has been previously irrigated. Such metadata may also include soils metadata such as information relating to previous crop grown on or in the soil, tillage practice, soil composition, presence of and sufficiency of surface and/or subsurface drainage, nutrient composition, rate of degradation, rate of water movement in both a lateral and vertical direction, and presence of materials such as salts in soil strata. The input data 110 may additionally include irrigation specifications 120. Irrigation-specific data may include the type (or specific mechanism) of delivery system 121 or systems to be used in applying artificial precipitation 1, and the timing and location 122 of past irrigation activity in a particular field. Example of types and mechanisms of delivery systems 121 specified in such data may include surface irrigation, sub-surface irrigation, flood irrigation, drip irrigation, or spray irrigation, and may further specify other information such as whether the systems used are pivot or center-pivot systems, or systems that have been configured as linear move, lateral move, wheel-move, or side-roll irrigation systems. Irrigation specifications 120 may also include metadata, such as information relating to delivery system type/mechanism and manufacturer characteristics, and associated resources and costs of delivery systems.

Still other types of input data 110 ingested into the present invention may include image-based data 123, vehicular data 124, and crowd-sourced observational data 125. Image-based data 123 may be derived from systems such as video cameras, and vehicular data 124 may be generated from one or more vehicle-based sensing systems, including those systems coupled to computing systems configured on farm equipment, or those systems configured to gather weather data from mobile devices present within vehicles, such as with mobile telephony devices and tablet computers. Input data 110 of various types may also be provided by crowd-sourced observations 125, for example from field workers, scientists, growers, farmers and others using mobile telephony devices or tablet computers, or any other computing devices, that incorporate software tools such as mobile applications for accessing and using social media feeds.

Regardless of type, input data 110 is ingested into the irrigation modeling framework 100 and applied to one or more precision agriculture (agronomic) models 150 to perform simulations 152 and produce output data 160. The output data 160 is represented by one or more soil-plant-atmosphere profiles 161 that each reflect outcomes of simulations performed by the one or more agronomic models 150 to achieve the desired outcomes. These profiles 161 are provided to the irrigation support tool 170 to assist users with an application of artificial precipitation 102 to a field 104. Profiles 161 may also be provided to one or more application programming interface (API) modules 180 for further follow-on or downstream uses of the modeling outcomes included therein. Regardless, profiles 161 represent multi-layered assessments of a moisture state in the soil system 106 in a field 104, and are tailored to provide information specific to the modeling performed.

As noted above, the one or more agronomic models 150 comprise a customized land surface model that evaluates the input data 110 to generate irrigation-specific outcomes for users 190. The customized land surface model is, in one embodiment of the present invention, a coupled crop and soil simulation model(s) 151, the construct of which depends at least in part on the outcome desired. For example, in one embodiment, physical and empirical characteristics that relate to a moisture state in a crop root zone of the soil system are used to simulate soil-water characteristics in the crop root zone, relative to one or more crop growth stages of a crop in the particular field. Such soil-water characteristics include a crop's water usage, a depth profile of where water is extracted from by the crop at the one or more growth stages, adequacy of water supply at the soil depth, and an impact of prior irrigation activity on the moisture state. Accordingly, a customized land surface model comprised of a coupled crop and soil simulation model(s) 151 that evaluates particular physical and empirical aspects of the moisture state relative to these soil-water characteristics is developed and applied.

In another example, physical and empirical characteristics that relate to a moisture state and its ability to support movement of water and nutrients to one or more root zone depths within a soil-crop system 106 are used to simulate moisture flows within the soil system 106. This application of one or more coupled crop and soil simulation models analyzes a rate of water movement at one or more growth stages of a crop, and its effect on a transport of nutrients applied to the soil system 106 to the spatially-distributed crop root system. Accordingly, a customized land surface model that evaluates particular physical and empirical aspects of the moisture and nutrient states relative to the transport of an applied nutrient (or nutrients resident within) a soil-crop system 106 for uptake by a growing crop is developed and applied.

In a further example, physical and empirical characteristics that relate the available water holding capacity of a soil system 106 and one or more growth stages of the crop are used to simulate leaching and denitrification of nutrients relative to one or more crop growth stages of the crop. Accordingly, a customized land surface model that evaluates particular physical and empirical aspects of the moisture state relative to drainage and saturation characteristics is developed and applied.

The customized land surface model in the one or more agronomic models 150 is performed in a plurality of data processing modules 130 within a computing environment 140 that also includes one or more processors 142 and a plurality of software and hardware components. The one or more processors 142 and plurality of software and hardware components are configured to execute program instructions to perform the functions of the irrigation modeling framework 100 described herein, and embodied in the one or more data processing modules 130.

The plurality of data processing modules 130 include a data ingest module 131 configured to ingest, request, acquire, or otherwise obtain the input data 110, and a physical and empirical agricultural models module 132 configured to initialize and prepare the one or more agricultural models 150 for the simulations 152 to be performed within the coupled crop and soil simulation model(s) 151. The plurality of data processing modules 130 also includes a profile building module 133, configured to build the profile(s) 161 generated from the simulations 152 performed by the one or more agronomic models 150. The plurality of data processing modules 130 may also include an artificial intelligence module 134 configured to apply a layer of artificial intelligence to the irrigation modeling framework 100 to develop relationships between input data 110 and outputs from other agronomic models to perform and improve the assessments, diagnoses, simulations, forecasts, and predictions that are used to build the plurality of profiles 161.

The plurality of data processing modules may also include one or more predictive weather models 135, which are configured to diagnose and predict expected weather conditions 126 at or near the particular field 104 from the weather and location specifications 111. The expected weather conditions 126 are then applied to the physical and empirical agricultural models module 132 to perform the simulations 152 in the customized land surface model described herein.

One or more other predictive data models 136 may also be included in the plurality of data processing modules 130. These models 136 allow the present invention to incorporate other predictions and forecasts generated from the input data 110, such as for example crop growth predictions and harvest forecasts, predictive soil conditions, and information on possible pest and disease infestations in both soils and crops. One example of other predictive data is crop growth data generated from an augmented crop growth model, such as that described in U.S. Pat. No. 9,131,644.

The plurality of data processing modules 130 may further include, as discussed in detail herein, one or more processes for analyzing thermal images in imagery data 116. These processes include data disaggregation techniques 138, and data fusion techniques 139. These techniques 138 and 139 comprise mathematical formulas and calculations in functions that resolve spatial and temporal resolution issues in the thermal images, and enable the imagery data 116 to be used to estimate historical evapotranspiration rates for the particular field 104 for a desired period of time and at a desired image resolution or for a desired area. Comparison of historical evapotranspiration rates derived from techniques 138 and 139 with those derived from the coupled crop and soil simulation models 151 allow discernment of historical irrigation and precipitation events for the particular field 104. The data disaggregation techniques 138 and the data fusion techniques 139 include algorithm(s) that perform scale splitting and image blending functions to improve the quality of remotely-sensed imagery data 116 from multiple sensors by integrating distinct spectral, spatial and temporal characteristics and pixel analyses between images to produce data for the desired period of time, image resolution, and area.

The customized land surface models comprising the one or more agricultural models 150 have been, as noted above, configured to simulate conditions within a field 104 related to a moisture state of the soil system 106 therein. Existing land surface models are customized within the present invention in many different ways, to produce particular output data streams as required by the situation being modeled. For example, a land surface model may be customized to simulate a water deficit and its impact on crop development. A land surface model may also be configured to analyze different vegetation/crop(s), and at different growth stages/heights or under different levels of stress. Other examples of possible analyses include a simulation of soil-water characteristics 153 for an understanding of current moisture conditions in the soil system 106 to advise users regarding future irrigation activities, a simulation of moisture flows 154 emphasizing characteristics such as water transport/distribution within the soil column, horizontal variances with soil, canopy wetness, and the impact of prior applications of artificial precipitation, for recommendations related to applying nutrients for uptake by a growing crop, and a simulation of an available water holding capacity 154 for minimizing losses of water and nutrients in the soil system.

Simulations 152 involving evaporation and water accumulation in a soil system 106 may further include, for example, analyzing an amount of water applied to the soil system 106 through effective rainfall and irrigation. Simulations 152 may also include analyzing an amount of water that is retained in a dynamically-growing root zone, and analyzing an amount of water depleted from the dynamically-growing root zone. Each of these simulations 152 examine different moisture and soil characteristics, and it is therefore to be understood that the customized land surface modeling paradigms applied herein to perform the irrigation modeling framework 100 of the present invention may include many different configurations, and are not to be limited to any one specific customized land surface model described herein.

Output data 160, and the plurality of profiles 161, are used to generate one or more of irrigation advisories 165, irrigation recommendations 166, irrigation schedules 167 and predictions and/or forecasts 168 of artificial precipitation needs. These may be provided directly to users 190, or they may be generated by the irrigation support tool 170 and provided to users 190 accessing or subscribing to such a tool 170. Regardless, they may be tailored to specific irrigation management actions, and to specific management zones of a particular field 104.

Additionally, the plurality of profiles 161 may be provided to one or more API modules 180, so that the advisories 165, recommendations 166, schedules 167, and predictions and/or forecasts 168 may be configured for third parties as alerts, services, or other downstream reporting. These may also be tailored to specific irrigation management actions, and to specific management zones of a particular field 104.

Many examples of alerts, services and reporting provided by the API modules 180 are possible and within the scope of the present invention. For example, the present invention may provide current and historical weather information service 181. Other services that may be provided are a soil modeling service 182 and a soil condition forecast report 183. Crop alerts 184 may also be configured as a service, as well as rangeland and livestock herd alerts 185. Other alerts include an irrigation alert 186 that may provide specific information as to irrigation cost, irrigation timing, irrigation location, and an amount of artificial precipitation to be applied for optimal or desired soil conditions, and/or for optimal or desired crop growth. A fertilizer or chemical runoff alerts 187 that may provide information to growers or crop advisors about specific environmental or regulatory issues following an application of artificial precipitation. Irrigation scheduling 188 may also be provided as service through the API modules 180, for example to provide a specific output of information to control an automated application of artificial precipitation. Such a service 188 may also be configured to provide reports, such as reports to regulatory authorities regarding the use of water in certain drought-hit areas, and the use of water where particular chemicals have also be applied to a field 104.

ClearAg and other related alerting is still another advisory service 189 contemplated by the present invention, and may include one or more of the alerts and services already described. ClearAg is a proprietary application offering a suite of precision agriculture services, includes alerts that provide subscribers and other users with actionable information regarding harvest, planting, irrigation, pest/disease, nutrient, and other issues attendant to crop, field, and soil management.

Figure 2:
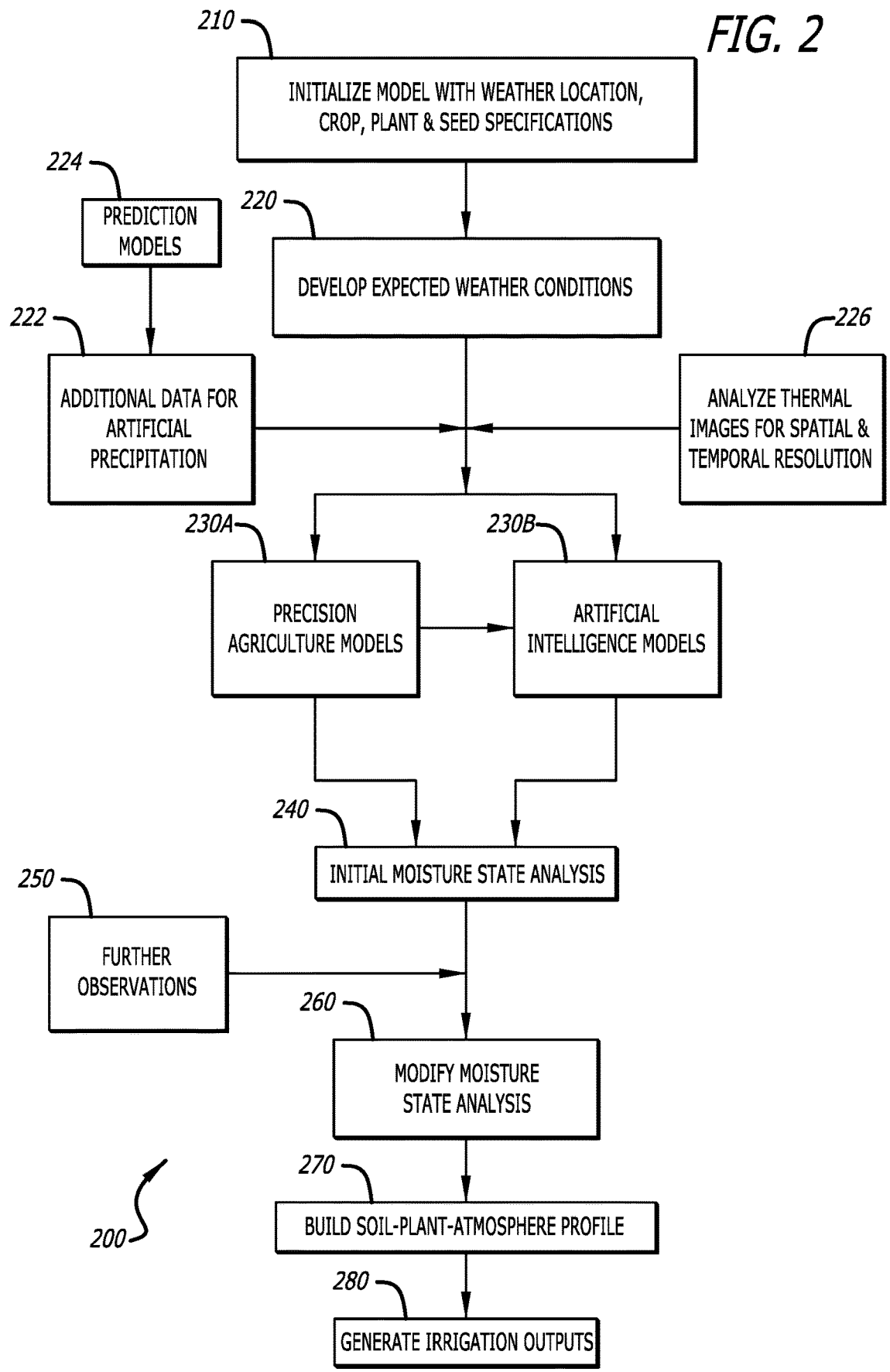
FIG. 2 is a block diagram of information flow and steps performed within an irrigation modeling framework according to the present invention.

FIG. 2 is a diagram 200 of information flow and steps performed within the present invention. The irrigation modeling framework 100 is initialized at step 210 by receiving various input data 110, such as weather and location specifications 111 and crop and plant specifications 117. The present invention uses at least the weather and location specifications 111 to develop, at step 220, predictions of expected weather conditions 126, using one or more weather modeling approaches as discussed further herein. Additional input data 110 may also be applied for simulation in the customized land surface modeling approach of the present invention. As noted above, the irrigation advisory modeling framework 100 may utilize one or more other predictive data models 136 for generating predictions or forecasts relating to the input data 110 at step 224, such as for example augmented crop growth model (as described in U.S. Pat. No. 9,131,644) and other crop-specific growth models. Data related to specific conditions of artificial precipitation 102, such as irrigation-specific data 120, may also be applied at step 222.

The expected weather conditions 126, and input data 110 (including any additional data, such as irrigation-specific data 120 or other predictive data), are then applied in step 230A to the one or more agricultural models 150 to perform the simulations 152 described above in the form of one or more coupled crop and soil simulation models 151. As noted above, the one or more agricultural models 150 (and the coupled crop and soil simulation model(s) 151) represent a customized land surface model. These simulations 152 produce an initial assessment of a moisture state in a soil system 106 in a particular field 104 at step 240. This initial moisture state assessment is used to build the plurality of profiles 161, as noted herein.

The present invention may apply one or more additional data processing functions to imagery 116 to analyze thermal images for spatial and temporal resolution at step 226, for example to diagnose soil-crop moisture data for specific historical time periods. In this embodiment, the process 200 ingests imagery data 116 to identify moisture content at a specific spatial element within the images, and at a specific temporal element within the images. The techniques 138 and 139 allow for scale splitting and image blending, across multiple images, to enable an estimate of historical evapotranspiration rates and latent heat flux associated with these evapotranspiration rates for the particular field 104. Thermal images are analyzed in step 226 in a data disaggregation process(es) 138 and a data fusion process(es) 139, which as noted above include performing mathematical formulas and calculations on pixel and other data within each image to resolve spatial and temporal resolution issues. An output from such processes 138 and 139 are then provided to the coupled crop and soil simulation model(s) 151 to assess a state of moisture content of the soil-crop system 106 in the particular field 104 over time.

In another embodiment, the present invention takes the output of the simulations 152 performed in the coupled crop and soil simulation model(s) 151 in step 230a and may ingest input data 110 representing further observations (such as for example other image data 123, vehicular data 124, and crowd-sourced observations 125) at step 250. These further observations are used to perform modifications, at step 260, of the simulations that led to the initial moisture state evaluation at step 240. This step acts as feedback to modulate the outcome of the simulations 152 performed using, for example, one or more in-field and/or sensed observations of actual conditions experienced in the particular field 104.

Regardless of whether such modifications to simulations 152 are performed, the present invention produces a soil-plant-atmosphere profile at step 270 from the outcomes of the coupled crop and soil simulation models 151 that reflect a moisture state being modeled. As noted above, profiles 161 may at least include a root zone moisture profile 162, a soil-nutrient transport profile 163, and a temperature, moisture and drainage profile 164. Regardless of the type of profile 161 built in the present invention, it is used at step 280 to generate artificial precipitation-related output data 160 in the form of irrigation advisories 165, irrigation recommendations 166, irrigation schedules 167, and/or predictions and forecasts 168 to users directly, to the irrigation support tool 170, or third parties as alerts, services, indicators, or reports. These, as noted above, may be tailored to specific irrigation management actions, and to specific management zones of a particular field 104.

Output data 160 from the agricultural models 150 may also, in one or more additional embodiments, be further applied to develop specific artificial intelligence models in step 230b for further assessment of the soil-plant-atmosphere system for the particular field 104, such as for example specific models configured to analyze the soil-water relationship in a soil system 106. The irrigation modeling framework 100 may therefore include a layer of artificial intelligence to develop relationships between input data 110 and outputs from other agricultural models 150 to perform the simulations 152 (and other forecasts, diagnoses, and predictions generated as a result of these simulations 152) represented in the profiles 161.

The present invention contemplates that these relationships may be developed in a variety of different ways. For example, the artificial intelligence module 134 is configured to adjust to input data 110 that includes observations provided from fields that are local or even distributed across a region. Other data applied to the artificial intelligence module 134 includes, as noted above, output from other agricultural models 150, and it is further contemplated that the original datasets for such models 150 may be collected from the various sources that produce them, and analyzed within the present invention. Regardless, observations may be either quantitative (e.g. grain moisture level as tested) or qualitative (e.g. the plant material became harvestable or unharvestable at a given time and location, whether or not because of environmental factors). Such information can be analyzed with respect to both recent and current weather and soil conditions, and the corresponding agronomic model outputs, to make appropriate adjustments to the unaltered agronomic model output that would otherwise be provided to the user. This information can also be used to provide updated guidance to other users in similar circumstances (with respect to locale, crop, etc.).

The artificial intelligence module 134 uses associated weather conditions, agronomic and other agricultural model outputs, environmental considerations, crop characteristics, and other relevant data, together with empirical observations where applicable, to build a more comprehensive dataset that can be used to make far-reaching improvements to (or even replacements for) the associated physical models for diagnosing and predicting the underlying harvest-related condition. For instance, the artificial intelligence layer can be applied to an adequately-sized dataset to draw automatic associations between the available external data and the moisture condition, effectively yielding a 'black box' model for simulating the specific characteristics needed. As more and more data are accumulated, the data can be sub-sampled, the artificial intelligence layer retrained, and the results tested against independent data in an effort to find the most reliable model. Further, such a model implicitly yields information as to the importance of related factors through the resulting weighting systems between inputs, subcomponents within the artificial intelligence layer, and the model output(s). This information may be used to identify which factors are particularly important or unimportant in the associated process, and thus help to target ways of improving the model over time.

The present invention contemplates that many different types of artificial intelligence may be employed within the scope thereof, and therefore, the artificial intelligence module 134 may include one or more of such types of artificial intelligence. The artificial intelligence module 134 may apply techniques including, but not limited to, k-nearest neighbor (KNN), logistic regression, support vector machines or networks (SVM), and one or more neural networks.

The use of artificial intelligence in the irrigation modeling framework 100 of the present invention enhances the utility of physical and empirical models 150 by automatically and heuristically constructing appropriate relationships, mathematical or otherwise, relative to the complex interactions between growing and maturing plants, the environment in which they reside, the underlying processes and characteristics, and the observational input data made available to the system. For example, where predictive factors known to be related to a particular outcome are known and measured along with the actual outcomes in real-world situations, artificial intelligence techniques are used to 'train' or construct a model that relates the more readily-available predictors to the ultimate outcomes, without any specific a priori knowledge as to the form of those relationships.

Many examples of output data 160 are possible, and are within the scope of the present invention. The irrigation model framework 100 is configured to forecast, in one aspect of the present invention, an irrigation schedule 167 to address a water deficit relative to a crop's development in the soil-plant-atmosphere system over time. This irrigation schedule 167 is generated from the soil-plant-atmosphere profiles 161 generated by the simulations 152 described, and may include information such as when, how, where, and how much artificial precipitation 102 to apply to a particular field 104. One or more advisories 165 related to the forecasted irrigation schedule 167 may also be generated from the profiles 161.

In one embodiment of the present invention, output data 160 may also be applied to the irrigation support tool 170 to generate a plurality of indicators for users 190 in managing irrigation activities. These indicators may include an indicator of field water loss from modeled evaporation and evapotranspiration and forecasted precipitation, an indicator for the use of one or more of flood, drip, and spray irrigation techniques in irrigation management, and an indicator for application of artificial precipitation 102 that is tailored for a crop's current growth stage and for forecasted upcoming crop growth stages.

Many other indicators are possible, and are within the scope of the present invention. It is to be understood that a user 190 may customize and create indicators generated using the irrigation support tool 170, such as for example indicators representing different management zones of a field 104. Additional examples of indicators that are possible include an indicator of one or both of cost reduction and waste-of-water reduction in locations affected by drought, an indicator of irrigation requirements for achieving crop temperature and crop moisture thresholds for producing and storing feed for livestock herd management, and an indicator of an environmental impact from runoff of one or both of fertilizers and chemicals.

As noted above, site-specific and variable-rate outputs are also contemplated. These may include an indicator of dynamic, site-specific variable rate irrigation representing an adjustable application of artificial precipitation 102 at different locations within a field 104, and an indicator of dynamic, crop-specific variable rate irrigation representing an adjustable application of artificial precipitation 102 for different crops planted at different locations within a field 104.

As described above, the irrigation modeling framework 100 ingests many different types of weather information for application to the modeling approach(es) discussed above. This includes real-time, historical, and forecasted field-level data representative of assessments of localized weather conditions, and may include long-range climatological and/or meteorological forecasting, in one or more predictive weather models.

Such information representative of assessments of localized weather conditions may be produced by many different sources of meteorological data to provide one or more of observed weather data and current field-level weather data, and predicted weather data. Such additional sources of weather data may include data from both in-situ and remotely-sensed observation platforms. For example, numerical weather prediction models (NWP) and/or surface networks may be combined with data from weather radars and satellites to reconstruct the current weather conditions on any particular area to be analyzed. There are numerous industry NWP models available, and any such models may be used as sources of meteorological data in the present invention. Examples of NWP models at least include RUC (Rapid Update Cycle), WRF (Weather Research and Forecasting Model), GFS (Global Forecast System) (as noted above), and GEM (Global Environmental Model). Meteorological data is received in real-time, and may come from several different NWP sources, such as from the European Centre for Medium-Range Weather Forecasting (ECMWF), Meteorological Services of Canada's (MSC) Canadian Meteorological Centre (CMC), as well as the National Oceanic and Atmospheric Administration's (NOAA) Environmental Modeling Center (EMC), and many others. Additionally, internally or privately-generated "mesoscale" NWP models developed from data collected from real-time feeds to global and localized observation resources may also be utilized. Such mesoscale numerical weather prediction models may be specialized in forecasting weather with more local detail than the models operated at government centers, and therefore contain smaller-scale data collections than other NWP models used. These mesoscale models are very useful in characterizing how weather conditions may vary over small distances and over small increments of time. The present invention may be configured to ingest data from all types of NWP models, regardless of whether publicly, privately, or internally provided or developed.

Long-range climatological and/or meteorological forecasting may be generated by, in one aspect of the present invention, dynamical extended range weather forecast models generated from known methods for inter-seasonal to inter-annual climate prediction, which have evolved into a combination of deterministic and statistical modeling schemes that permit the capture of long-term low-frequency features. Such forecasting often requires global analyses for the specification of observed initial and boundary conditions, the use of sophisticated numerical weather prediction models, a statistical treatment of the model results, and a verification of the forecast results as a feedback into forecast refinement.

As noted above, another type of input data is field-level processed remotely-sensed imagery data 116. One source of this remotely-sensed imagery data 116 is satellite systems, such as fine temporal resolution low-earth orbit satellites that provide a minimum of three spectral bands and other resource-monitoring satellites, as well as from unmanned airborne systems (UAS) such as unmanned aerial vehicles and remotely-piloted vehicles, commonly referred to as drones. Other sources are also contemplated, such as for example unmanned aerial systems, manned aerial reconnaissance, lower temporal frequency earth resources satellite such as LANDSAT and MODIS, ground-based robots, and sensors mounted on field and farm equipment. Regardless of the source, this imagery data 116 is field-navigated to provide users with the most recent high-resolution depiction of the crop field. Imagery data 116 may be delivered on a web or application-based tool configured within the present invention, and additional tools may be provided for spatially navigating the imagery data 116 and overlaying a variety of weather data elements.

Imagery data 116 in conjunction with coupled crop and soil simulation models 151 may, as noted above, be used to detect and diagnose prior irrigation or other precipitation events for a particular field 104 and/or a soil-crop system 106. Comparisons of imagery data 116 with output from coupled crop and soil simulation models 151 may be used to identify irrigation and precipitation events for prior growing seasons and a current growing season, and therefore be incorporated into further instantiations of the coupled crop and soil simulation models 151 to provide data for both long and short-term historical events. This enables additional input data 110 to be used in the present invention without putting an unwanted burden on users, and also to reduce the potential for forgotten or mis-entered historical data to adversely impact future model results.

Many sources of imagery data 116 provide thermal images, such as data in thermal infrared, or TIR bands collected from certain satellites. Many satellite systems in use today are capable of remote thermal sensing of the Earth's land surface, and thermal images from such satellites are a valuable way of diagnosing conditions such as water stress and drought prevalence. Thermal imaging can also be used in lieu of precipitation data by directly providing much-needed information on both soil and crop moisture status where data collection is poor, or as in the present invention, where there is a limited set of historical precipitation and irrigation data.

From thermal images in the imagery data 116, information may be extracted to discern and map latent heat flux associated with prior evapotranspiration rates. The ability to map and estimate soil-crop moisture data due to historical irrigation and precipitation events via satellite has broad applications in monitoring drought and water consumption, administering irrigation projects, predicting water demand, and providing information for hydrological and weather forecast computer models, and this provides a distinct advantage over past satellite-based measures of soil moisture, as they are of higher spatial and temporal resolution. One can greatly improve the utility of such imagery data 116, and consequently improve modeling outputs in the present invention to arrive at more accurate assessments of a state of moisture content of a soil-crop system in the particular field 104 over time, and root zone moisture profiles from such assessments, by comparing outputs generated by the coupled crop and soil simulation model(s) 151 as described herein, with historical values of evapotranspiration from past events derived from TIR data.

Such information may be used, for example, to identify when a crop has reached a point in time where irrigation recommendations are no longer required. Towards the end of an annual crop's life cycle, transpiration slows considerably and eventually ceases altogether. This means that irrigation no longer becomes necessary, and recommendations or advisories should no longer be provided, regardless of soil moisture state. This may vary from species to species and to a lesser extent between varieties, as when this should occur depends at least in part on the crop's phenology. Regardless, knowledge of historical irrigation and other precipitation events, combined with end of season crop conditions, may assist in providing recommendations for the irrigation within the current growing season, and therefore the present invention may use data derived from imagery in a methodology for end-of-season irrigation that uses the output of one or more growth stage models in conjunction with standard practices for a given crop, to determine when irrigation recommendations should end.

Also as noted above, the irrigation modeling framework 100 of the present invention may incorporate techniques in satellite data disaggregation 138 and fusion 139 to estimate latent heat flux from historical evapotranspiration and surface and root zone soil moisture at desired high spatial and temporal resolutions, to introduce higher quality and/more detailed historical information to the simulations 152 performed in the one or more agricultural models 150 (and the coupled crop and soil simulation model(s) 151). The output of these processes 138 and 139 may then be contrasted with output of an existing model to identify likely irrigation events in the past.

For example, outputs of existing models may be incorporated to map evapotranspiration and other relevant moisture data. In one embodiment, a surface energy balance model may be applied in the one or more additional predictive data models 136 (or otherwise applied as an input to the coupled crop and soil simulation models 151). Such a model is designed to minimize the need for ancillary meteorological data, while maintaining a physically realistic representation of land-atmosphere exchange over a wide range in vegetation cover conditions, and exploits the high temporal resolution afforded by geostationary satellites. Models such as a surface energy balance model estimate evapotranspiration and other data by partitioning the energy available at the land surface into turbulent fluxes of sensible and latent heating, yielding a surface temperature metric which helps to evaluate distinctive thermal signatures associated with the soil and canopy components of the scene captured by imagery data.

Such models may be constrained to operate on limited, larger spatial scales of 5-10 km, and therefore one may wish to apply a disaggregation technique to split a scale of measurements, such as for example a spatial flux disaggregation technique, which uses air temperature diagnoses from the model along with higher resolution TIR imagery to downscale flux estimates (for example, at a 10 km resolution) to smaller, more localized measurements on the order of for example 100-1000 meters. Such a disaggregation of data from blended images also facilitates high spatial resolution assessment of moisture flux and stress conditions from coarser image resolutions, but is also constrained in temporal resolution, such as by the overpass frequency of the providing satellite. Nonetheless, use of such models along with disaggregation techniques facilitates scalable flux and moisture stress mapping using thermal imagery, enabling one to zoom in from a larger, national scale to smaller areas of specific interest. Specific models include ALEXI and disALEXI, and these may be incorporated into the present invention to perform the data disaggregation process 138 at least in part.

One can solve the problem of temporal constraints by fusing different types of imagery data to inform a temporal interpolation of high-resolution evapotranspiration and soil moisture conditions, in a process that combines data originating from different sources to obtain information of greater accuracy or quality. One technique generates daily, monthly and seasonal evapotranspiration estimates at the 30-m scale (as is needed for many agriculture water management applications), and directly interpolates between infrequent images to capture evaporative response to temporal variability from issues such as radiation load and atmospheric demand. However, one may still face the problem of having only two or three clear TIR images per growing season, providing insufficient temporal sampling to reliably assess daily and cumulative water consumption. Specific data fusion models, such as the Spatial Temporal Adaptive Reflectance Fusion Model (STARFM), the enhanced version of STARFM (ESTARFM), and the Spatial Temporal Adaptive Algorithm for mapping Reflectance Change (STAARCH) may be incorporated to improve seasonal high-resolution evapotranspiration estimates by integrating daily information at moderate resolution from one satellite or sensor, with periodic high-resolution maps from another.

Data fusion techniques often use spectrally similar pixels from one set of images (such as Landsat images) and temporal changes determined from another set (such as MODIS). In such an example, the approach predicts Landsat resolution reflectance at the MODIS acquisition date, based on the temporal change from MODIS and a deterministic weighting function determined by spectral similarity, temporal difference, and spatial distance. Information from these image pairs are then fused, generating disaggregated maps that may then be applied to daily captures of images of a particular field 104, thus forming a continuous time series at the desired resolution.

Stated differently, evapotranspiration and other relevant data may be discerned by creating moderate to high resolution images from coarse resolution satellite imagery using higher resolution images collected at nearly the same time. For example, a 5 km resolution thermal infrared image (for example, a GOES image) at one time might be used in conjunction with a 60 m resolution from a different source (for example, 60 m Landsat TIR image) at the same time to produce a 60 m resolution evapotranspiration map that represents conditions at that same time. However, since overpasses of a particular spot on earth only occur at certain time intervals, day-to-day changes in the coarse resolution data can be used to estimate changes at a finer scale to produce a set of evapotranspiration data that have both high spatial resolution (60-m) using disaggregation techniques, and high temporal resolution (daily) from using fusion techniques.

In precision agriculture, growers often engage crop advisors and/or access automated processes for decision-making or recommendations, for example as to irrigation scheduling or specifically as to the type, location, and amount of artificial precipitation 102 to apply. It is often advantageous to define a set of management zones for irrigation events in a particular field 104 that represent, for example, different locations or areas in the field 104. These zones enable a variable rate application of artificial precipitation 102. The advisories 165, recommendations 166, scheduling 167, and predictions and forecasts 168, and other output data 160 may therefore be tailored to specific irrigation management actions, and to specific management zones, in the particular field 104. For example, the present invention may generate an irrigation recommendation for a site-specific, variable rate, and adjustable application of artificial precipitation 102 according to one or more management zones specified by a user 190. The present invention may also generate an irrigation recommendation for a dynamic, crop-specific variable rate, adjustable application of artificial precipitation 102 for different crops planted in one or more management zones, at different growth stages. It is to be understood that the present invention may therefore be configured in any number of ways to provide site-specific and variable-rate artificial precipitation recommendations according to management zones defining fields 104.

The systems and methods of the present invention may be implemented in many different computing environments 140. For example, they may be implemented in conjunction with a special purpose computer, a programmed microprocessor or microcontroller and peripheral integrated circuit element(s), an ASIC or other integrated circuit, a digital signal processor, electronic or logic circuitry such as discrete element circuit, a programmable logic device or gate array such as a PLD, PLA, FPGA, PAL, and any comparable means. In general, any means of implementing the methodology illustrated herein can be used to implement the various aspects of the present invention. Exemplary hardware that can be used for the present invention includes computers, handheld devices, telephones (e.g., cellular, Internet enabled, digital, analog, hybrids, and others), and other such hardware. Some of these devices include processors (e.g., a single or multiple microprocessors), memory, nonvolatile storage, input devices, and output devices. Furthermore, alternative software implementations including, but not limited to, distributed processing, parallel processing, or virtual machine processing can also be configured to perform the methods described herein.

The systems and methods of the present invention may also be partially implemented in software that can be stored on a storage medium, non-transitory or otherwise, executed on programmed general-purpose computer with the cooperation of a controller and memory, a special purpose computer, a microprocessor, or the like. In these instances, the systems and methods of this invention can be implemented as a program embedded on personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Additionally, the data processing functions disclosed herein may be performed by one or more program instructions stored in or executed by such memory, and further may be performed by one or more modules configured to carry out those program instructions. Modules are intended to refer to any known or later developed hardware, software, firmware, artificial intelligence, fuzzy logic, expert system or combination of hardware and software that is capable of performing the data processing functionality described herein.

The foregoing descriptions of embodiments of the present invention have been presented for the purposes of illustration and description. It is not intended to be exhaustive or to limit the invention to the precise forms disclosed. Accordingly, many alterations, modifications and variations are possible in light of the above teachings, may be made by those having ordinary skill in the art without departing from the spirit and scope of the invention. It is therefore intended that the scope of the invention be limited not by this detailed description. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a sub-combination or variation of a sub-combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what essentially incorporates the essential idea of the invention.

The invention claimed is:

1. A method, comprising:
ingesting, as input data, weather and climatological information that includes at least one of historical field-level weather data and extended-range weather forecast data, crop-specific information relative to a particular field, soil profile data, and remotely-sensed imagery data providing thermal images of the particular field;
modeling the input data in a plurality of data processing modules within a computing environment in which the plurality of data processing modules are executed in conjunction with at least one specifically-configured processor, the data processing modules configured to assess a state of moisture content of a soil-crop system in the particular field over time, by
1) diagnosing and predicting expected weather conditions at or near the particular field from the weather and climatological information, 2) aggregating the ingested input data in a land surface model customized to simulate crop water usage over time, soil moisture depletion at multiple depths within the soil-crop system over time, and soil-water characteristics at the multiple depths relative to one or more crop growth stages over a crop growing season in the particular field, the soil-water characteristics including a depth profile of water extraction by the crop at the one or more growth stages, and an impact of prior irrigation activity on the state of moisture content, 3) analyzing the thermal images to resolve inconsistencies in spatial and thermal resolutions to diagnose soil-crop moisture data for the particular field, by applying one or more disaggregation functions to identify moisture fluxes at a specific spatial element between the images, and one or more fusion functions to identify moisture fluxes at a specific temporal element within the images, the specific spatial element and the specific temporal element enabling an estimate of historical irrigation and other precipitation events for the particular field from the soil-crop moisture data, the one or more disaggregation functions operating to normalize soil-crop moisture data represented in different spatial resolutions of the images to identify an occurrence of the prior irrigation activity in the particular field, and not a neighboring field represented within a spatially-similar coarse pixel resolution of the images, and the one or more fusion functions operating to normalize soil-crop moisture data within images taken at different times to identify which specific day the prior irrigation activity occurred that is within a time span relative to data from overpasses for the particular field, 4) adjusting one or more simulation parameters in the land surface model based on identified differences between the simulations, and the estimate of historical irrigation and other precipitation events for the particular field from the soil-crop moisture data, and 5) estimating moisture content in the soil-crop system at any point in the crop growing season in one or more additional simulations; and developing an irrigation schedule from a root zone moisture profile representing the state of moisture content of the soil-crop system in the particular field over the crop growing season from the simulated crop water usage, soil moisture depletion and the soil-water characteristics, for delivering an application of water for the particular field, wherein a user applies water to the particular field based on the irrigation schedule or an automated application of water is controlled based on the irrigation schedule.

2. The method of claim 1, further comprising applying the root zone moisture profile to an irrigation advisory tool configured to provide one or more irrigation recommendations to a user.

3. The method of claim 2, wherein the irrigation advisory tool is further configured to generate one or more advisories for the particular field, the one or more advisories including an indicator of soil water loss from evaporation and evapotranspiration, an indicator of forecasted precipitation, an indicator of one or both of cost reduction and waste-of-water reduction in geographical locations affected by drought, an indicator of irrigation requirements for achieving crop temperature and crop moisture thresholds, and an indicator of environmental impact from runoff of one or both of fertilizers and chemicals.

4. The method of claim 2, wherein the one or more irrigation recommendations include a site-specific variable rate irrigation recommendation representing an adjustable application of water at the one or more management zones, and a dynamic, crop-specific variable rate irrigation recommendation representing an adjustable application of water for different crops planted at the one or more management zones.

5. The method of claim 2, wherein the one or more irrigation recommendations include a recommendation to stop irrigation, a recommendation to reduce irrigation over crop growth stages occurring late during a growing season, an irrigation recommendation to maintain soil moisture at a level that is consistent with a prior crop growing season, and a recommendation for irrigation of a particular field that is either pre-planting or post-planting irrigation depending on a crop type planted in the field, and a recommendation to reduce irrigation as a predicted harvest time for the crop approaches.

6. The method of claim 1, wherein the soil-water characteristics further include an amount of water applied to the soil system through effective rainfall and irrigation, an amount of water that is retained in a dynamically-growing root zone, and an amount of water depleted from the dynamically-growing root zone.

7. The method of claim 1, wherein the crop-specific information further includes one or more of crop type data, planting data, crop growth data, growth stage-dependent parameters indicative of the one or more crop growth stages, crop relative maturity data, crop planting depth and row spacing data, crop post-maturity dry-down characteristics, and targeted crop moisture or temperature thresholds.

8. The method of claim 1, wherein the input data further includes irrigation-specific information relative to past irrigation activity for the particular field, the irrigation-specific information including data representing an amount of water applied to the particular field, and data representing a water delivery mechanism, the water delivery mechanism including one or more of flood irrigation, drip irrigation, or spray irrigation.

9. The method of claim 1, wherein the land surface model is further configured to model one or more of mean average air temperature and a transpiration rate.

10. The method of claim 1, further comprising automatically developing an artificial intelligence soil-water model to analyze time-varying soil-water characteristics of a soil system, by building a comprehensive dataset for the land surface model models and applying the artificial intelligence soil-water model to predict the state of the moisture content in the soil-crop system in any field at any selected time.

11. A method, comprising:
within a computing environment comprised of a computer processor and at least one computer-readable storage medium operably coupled to the computer processor and having program instructions stored therein, the computer processor being operable to execute the program instructions to assess a state of moisture content of a soil-crop system in a particular field over time in an irrigation advisory model by:
predicting expected weather conditions impacting moisture conditions at multiple depths of a crop root zone in the soil-crop system in the particular field, by applying weather and climatological information comprised of historical field-level weather data and extended-range weather forecast data to one or more predictive numerical weather models;
simulating crop water usage over time, soil moisture depletion at multiple depths within the soil-crop system over time and soil-water characteristics at the multiple depths relative to one or more crop growth stages over a crop growing season in the particular field, by aggregating the expected weather conditions, crop-specific information, and soil profile data in a customized land surface model;
analyzing remotely-sensed imagery data to resolve inconsistencies in spatial and thermal resolutions to diagnose soil-crop moisture data for the particular field, by applying one or more disaggregation functions to identify moisture content at a specific spatial element between the images, and one or more fusion functions to identify moisture content at a specific temporal element within the images, the specific spatial element and the specific temporal element enabling an estimate of historical irrigation and other precipitation events for the particular field from the soil-crop moisture data, the one or more disaggregation functions operating to normalize soil-crop moisture data represented in different spatial resolutions of the images to identify an occurrence of the prior irrigation activity in the particular field, and not a neighboring field represented within a spatially-similar coarse pixel resolution of the images, and the one or more fusion functions operating to normalize soil-crop moisture data within images taken at different times to identify which specific day the prior irrigation activity occurred that is within a time span relative to data from overpasses for the particular field;
adjusting one or more simulation parameters in the land surface model based on identified differences between the simulations, and the estimate of historical irrigation and other precipitation events for the particular field from the soil-crop moisture data, and estimating moisture content in the soil-crop system at any point in the crop growing season in one or more additional simulations,
wherein the soil-water characteristics include a depth profile of water extraction by the crop at the one or more growth stages, and an impact of prior irrigation activity on the state of moisture content, to profile root zone moisture from the simulated from the simulated crop water usage over time, soil moisture depletion and the soil-water characteristics; and developing an irrigation schedule from the profile of root zone moisture for delivering an application of water for the particular field, wherein a user applies water to the particular field based on the irrigation schedule or an automated application of water is controlled based on the irrigation schedule.

12. The method of claim 11, further comprising preparing one or more irrigation recommendations for the application of water for the particular field over time from the profile of root zone moisture.

13. The method of claim 12, wherein the one or more irrigation recommendations include a site-specific variable rate irrigation recommendation representing an adjustable application of water at the one or more management zones, and a dynamic, crop-specific variable rate irrigation recommendation representing an adjustable application of water for different crops planted at the one or more management zones.

14. The method of claim 12, wherein the one or more irrigation recommendations include a recommendation to stop irrigation, a recommendation to reduce irrigation over crop growth stages occurring late during a growing season, an irrigation recommendation to maintain soil moisture at a level that is consistent with a prior crop growing season, and a recommendation for irrigation of a particular field that is either pre-planting or post-planting irrigation depending on a crop type planted in the field, and a recommendation to reduce irrigation as a predicted harvest time for the crop approaches.

15. The method of claim 11, further comprising applying the profile of root zone moisture to an irrigation advisory tool.

16. The method of claim 15, wherein the irrigation advisory tool is further configured to generate one or more irrigation advisories for the particular field from the profile of root zone moisture, the one or more advisories including an indicator of soil water loss from evaporation and evapotranspiration, an indicator of forecasted precipitation, an indicator of one or both of cost reduction and waste-of-water reduction in geographical locations affected by drought, an indicator of irrigation requirements for achieving crop temperature and crop moisture thresholds, and an indicator of environmental impact from runoff of one or both of fertilizers and chemicals.

17. The method of claim 11, wherein the soil-water characteristics further include an amount of water applied to the soil system through effective rainfall and irrigation, an amount of water that is retained in a dynamically-growing root zone, and an amount of water depleted from the dynamically-growing root zone, and wherein the crop-specific information further includes one or more of crop type data, planting data, crop growth data, growth stage-dependent parameters indicative of the one or more crop growth stages, crop relative maturity data, crop planting depth and row spacing data, crop post-maturity dry-down characteristics, and targeted crop moisture or temperature thresholds.

18. The method of claim 11, wherein the applying the expected weather conditions, crop-specific information, the soil profile data, and the field management data in a customized land surface model further includes applying irrigation-specific information relative to past irrigation activity for the particular field, the irrigation-specific information including data representing an amount of water applied to the particular field, and data representing a water delivery mechanism, the water delivery mechanism including one or more of flood irrigation, drip irrigation, or spray irrigation.

19. The method of claim 11, wherein the customized land surface model is further configured to model one or more of mean average air temperature and a transpiration rate.

20. The method of claim 11, further comprising automatically developing an artificial intelligence soil-water model to analyze time-varying soil-water characteristics of a soil-crop system, by building a comprehensive dataset for the customized land surface model and applying the artificial intelligence soil-water model to predict the moisture state in a soil-crop system in any field at any selected time.

21. A system comprising:
a computing environment including at least one computer-readable storage medium having program instructions stored therein and a computer processor operable to execute the program instructions to assess a state of moisture content of a soil-crop system in the particular field over time in an irrigation advisory model within a plurality of data processing modules, the plurality of data processing modules including:
a weather modeling module configured to predict expected weather conditions impacting moisture conditions at multiple depths of the soil-crop system in the particular field, by applying weather and climatological information comprised of historical field-level weather data and extended-range weather forecast data to one or more predictive numerical weather models;
one or more modules configured to simulate crop water usage over time, soil moisture depletion at multiple depths within the soil-crop system over time and soil-water characteristics at the multiple depths relative to one or more crop growth stages over a crop growing season in the particular field, by aggregating the expected weather conditions, crop-specific information, soil profile data, and the estimate of historical irrigation and other precipitation events for the particular field in a customized land surface model, and
one or more modules configured to analyze remotely-sensed imagery data to resolve inconsistencies in spatial and thermal resolutions to diagnose soil-crop moisture data for the particular field, by applying one or more disaggregation functions to identify moisture fluxes at a specific spatial element between the images, and one or more fusion functions to identify moisture fluxes at a specific temporal element within the images, the specific spatial element and the specific temporal element enabling an estimate of historical irrigation and other precipitation events for the particular field from the soil-crop moisture data, the one or more disaggregation functions operating to normalize soil-crop moisture data represented in different spatial resolutions of the images to identify an occurrence of the prior irrigation activity in the particular field, and not a neighboring field represented within a spatially-similar coarse pixel resolution of the images, and the one or more fusion functions operating to normalize soil-crop moisture data within images taken at different times to identify which specific day the prior irrigation activity occurred that is within a time span relative to data from overpasses for the particular field, and adjust one or more simulation parameters in the land surface model based on identified differences between the simulations, and the estimate of historical irrigation and other precipitation events for the particular field from the soil-crop moisture data, and estimating moisture content in the soil-crop system at any point in the crop growing season in one or more additional simulations, wherein the soil-water characteristics include a depth profile of water extraction by the crop at the one or more growth stages, and an impact of prior irrigation activity on the state of moisture content, to profile root zone moisture from the simulated crop water usage over time, soil moisture depletion and the soil-water characteristics; and an irrigation scheduling module configured to develop an irrigation schedule from the profile of root zone moisture for delivering an application of water for the particular field, wherein a user applies water to the particular field based on the irrigation schedule or an automated application of water is controlled based on the irrigation schedule.

22. The system of claim 21, further comprising generating one or more irrigation recommendations for the application of water for the particular field over time from the profile of root zone moisture.

23. The system of claim 22, wherein the one or more irrigation recommendations include a recommendation to stop irrigation, a recommendation to reduce irrigation over crop growth stages occurring late during a growing season, an irrigation recommendation to maintain soil moisture at a level that is consistent with a prior crop growing season, and a recommendation for irrigation of a particular field that is either pre-planting or post-planting irrigation depending on a crop type planted in the field, and a recommendation to reduce irrigation as a predicted harvest time for the crop approaches.

24. The system of claim 21, wherein the profile of root zone moisture is applied to an irrigation advisory tool configured to generate one or more irrigation advisories for the particular field from the profile of root zone moisture, the one or more advisories including an indicator of soil water loss from evaporation and evapotranspiration, an indicator of forecasted precipitation, an indicator of one or both of cost reduction and waste-of-water reduction in geographical locations affected by drought, an indicator of irrigation requirements for achieving crop temperature and crop moisture thresholds, and an indicator of environmental impact from runoff of one or both of fertilizers and chemicals.

25. The system of claim 22, wherein the one or more irrigation recommendations include a site-specific variable rate irrigation recommendation representing an adjustable application of water at the one or more management zones, and a dynamic, crop-specific variable rate irrigation recommendation representing an adjustable application of water for different crops planted at the one or more management zones.

26. The system of claim 21, wherein the soil-water characteristics further include an amount of water applied to the soil system through effective rainfall and irrigation, an amount of water that is retained in a dynamically-growing root zone, and an amount of water depleted from the dynamically-growing root zone, and wherein the crop-specific information further includes one or more of crop type data, planting data, crop growth data, growth stage-dependent parameters indicative of the one or more crop growth stages, crop relative maturity data, crop planting depth and row spacing data, crop post-maturity dry-down characteristics, and targeted crop moisture or temperature thresholds.

27. The system of claim 21, wherein irrigation-specific information relative to past irrigation activity for the particular field is also applied to the coupled crop and soil simulation models of one or more physical and empirical characteristics impacting the state of moisture content at multiple depths in the soil-crop system, the irrigation-specific information including data representing an amount of water applied to the particular field, and data representing a water delivery mechanism, the water delivery mechanism including one or more of flood irrigation, drip irrigation, or spray irrigation.

28. The system of claim 21, wherein the customized land surface model is further configured to model one or more of mean average air temperature and a transpiration rate.

29. The system of claim 21, further comprising an artificial intelligence module to analyze time-varying soil-water characteristics of a soil system, by building a comprehensive dataset for the customized land surface model and apply an artificial intelligence soil-water model to predict the moisture state in a soil system in any field at any selected time.

* * * * *

UNITED STATES PATENT AND TRADEMARK OFFICE
CERTIFICATE OF CORRECTION

| | | |
|---|---|---|
| PATENT NO. | : 11,026,376 B2 | Page 1 of 1 |
| APPLICATION NO. | : 16/179559 | |
| DATED | : June 8, 2021 | |
| INVENTOR(S) | : John J. Mewes and Robert C. Hale | |

It is certified that error appears in the above-identified patent and that said Letters Patent is hereby corrected as shown below:

In the Claims

In Claim 11:
Column 27, Line 3 should read in its entirety as follows: "zone moisture from the simulated"

Signed and Sealed this
Fifteenth Day of February, 2022

Drew Hirshfeld
*Performing the Functions and Duties of the
Under Secretary of Commerce for Intellectual Property and
Director of the United States Patent and Trademark Office*